US009670055B2

United States Patent
Reinmuth et al.

(10) Patent No.: US 9,670,055 B2
(45) Date of Patent: Jun. 6, 2017

(54) MICROMECHANICAL SENSOR UNIT AND METHOD FOR MANUFACTURING MICROMECHANICAL SENSOR UNITS

(71) Applicant: Robert Bosch GmbH, Stuttgart (DE)

(72) Inventors: Jochen Reinmuth, Reutlingen (DE); Julian Gonska, Reutingen (DE)

(73) Assignee: Robert Bosch GmbH, Stuttgart (DE)

( * ) Notice: Subject to any disclaimer, the term of this patent is extended or adjusted under 35 U.S.C. 154(b) by 352 days.

(21) Appl. No.: 14/530,437

(22) Filed: Oct. 31, 2014

(65) Prior Publication Data
US 2015/0123217 A1 May 7, 2015

(30) Foreign Application Priority Data
Nov. 6, 2013 (DE) .................. 10 2013 222 517

(51) Int. Cl.
| | |
|---|---|
| *B81B 3/00* | (2006.01) |
| *B81C 1/00* | (2006.01) |
| *G01P 15/00* | (2006.01) |
| *G01R 33/028* | (2006.01) |
| *G01P 15/08* | (2006.01) |

(52) U.S. Cl.
CPC ................ *B81B 3/00* (2013.01); *B81C 1/00* (2013.01); *B81C 1/00293* (2013.01); *G01P 15/00* (2013.01); *G01P 15/0802* (2013.01); *G01R 33/0286* (2013.01); *B81B 2201/0235* (2013.01); *B81B 2201/0242* (2013.01); *B81C 2203/0145* (2013.01)

(58) Field of Classification Search
CPC .............. B81B 3/00; B81C 1/00; G01P 15/00
USPC ......................................................... 257/415
See application file for complete search history.

(56) References Cited

U.S. PATENT DOCUMENTS

2012/0299127 A1* 11/2012 Fujii et al. .................... 257/415

FOREIGN PATENT DOCUMENTS

DE     10 2006 016 260     10/2007

* cited by examiner

*Primary Examiner* — Fernando L Toledo
*Assistant Examiner* — Adam S Bowen
(74) *Attorney, Agent, or Firm* — Norton Rose Fulbright US LLP; Gerard Messina

(57) ABSTRACT

A method for manufacturing a micromechanical sensor unit, the micromechanical sensor unit including a substrate and a sealing cap, in the first method step the substrate and the sealing cap being configured and joined in such a way that, as a result of bonding the sealing cap and the substrate, a first cavity, which has a first pressure and in which a first sensor element is situated, and a second cavity, which has a second pressure and in which a second sensor element is situated, are manufactured, in a second method step a sealable channel leading into the first cavity being created, in a third method step the first pressure in the first cavity being established via the sealable channel.

7 Claims, 4 Drawing Sheets

MICROMECHANICAL SENSOR UNIT AND METHOD FOR MANUFACTURING MICROMECHANICAL SENSOR UNITS

RELATED APPLICATION INFORMATION

The present application claims priority to and the benefit of German patent application no. 10 2013 222 517.2, which was filed in Germany on Nov. 6, 2013, the disclosure of which is incorporated herein by reference.

FIELD OF THE INVENTION

The present invention is directed to a micromechanical sensor unit.

BACKGROUND INFORMATION

Such a micromechanical sensor unit is discussed in the patent publication DE 10 2006 016 260 A1, for example, and allows multiple different sensor elements having different requirements in regard to the atmosphere surrounding them to be combined in one micromechanical sensor unit. The different sensor elements, typically an acceleration sensor and a rotation rate sensor, are situated in different cavities for this purpose and may include a seismic mass. For such micromechanical devices, it is generally provided to manufacture the different sensor elements simultaneously, i.e., in one method step, on a substrate, whereby particularly small and cost-effective combinations of different sensor systems are implementable in a single micromechanical sensor unit. The technical challenge for the micromechanical sensor units in question is to operate the sensor elements at the pressure which is intended for them in each case, which differs in most cases. While namely a low pressure (approximately 1 mbar) may be desirable for a rotation rate sensor, for example, so that the resonantly driven seismic mass of the rotation rate sensor experiences only minor damping, acceleration sensors may be operated at a pressure which is approximately 500 times greater. The related art usually uses getter materials for setting the desired pressure which differs from cavity to cavity. For example, this getter material is introduced into the cavity for which a low pressure is provided, and in an activated state is able to trap gas molecules, whereby the gas pressure in the cavity decreases. The getter material is usually activated by the temperature exceeding a threshold value. The use of additional getter materials, which are consequently associated with additional costs, in the manufacture of the micromechanical sensor unit proves to be a disadvantage in this case. It is the object of the present invention to make a micromechanical sensor unit available in which, on the one hand, sensor elements in different cavities having different pressures are combined; on the other hand, it may be implemented cost-effectively and without great complexity.

SUMMARY OF THE INVENTION

The object may be achieved by a method for manufacturing a micromechanical sensor unit which includes a substrate and a sealing cap. According to the present invention, it is provided that, in a first method step, the substrate and the sealing cap are joined in such a way that a first and a second cavity are created. A first sensor element, such as an acceleration sensor, is situated in the first cavity having a first pressure, while a second sensor element, such as a rotation rate sensor, is situated in the second cavity having a second pressure. Typically, the same pressure prevails in the first cavity and in the second cavity immediately after the first method step. According to the present invention, it is provided that, in a second method step, a sealable channel leading into the first cavity is then created. For example, the channel is integrated into the substrate and/or into the sealing cap. Subsequently, in a third method step, the first pressure in the first cavity is changed with the aid of the sealable channel, a first pressure being settable, which differs from the second pressure in the second cavity.

One advantage of the present invention over the related art is that the use of getter materials may be omitted with the present invention for manufacturing a micromechanical sensor unit having two cavities, and nonetheless different pressures are implementable in the two cavities. It is particularly advantageous that the pressures in the cavities are adaptable to the requirements of the sensor elements integrated into the cavities. In particular, it is possible with the method according to the present invention to dispense with a temperature increase necessary for activating the getter material. In this way, damage may advantageously be prevented, which otherwise could be caused by this temperature increase. Moreover, the present invention offers what may be a simple way to change the pressure in the cavity, the present invention also being characterized in that the pressure change may be carried out at almost any arbitrary point in time after the substrate and the sealing cap are bonded.

As a result, it is advantageously possible to have the change of the pressure in the first cavity take place at a point in time during the manufacturing chain which is useful or advantageous for the manufacture. It is possible for the substrate to include an evaluation wafer. Such an evaluation wafer may include conductors, electrodes and evaluation devices, with the aid of which the first and second sensor elements are connected in an electrically communicating manner to a printed circuit board or a chip. Moreover, it is conceivable for the first sensor element and/or the second sensor element to be integrated into the substrate and/or into the sealing cap or to be an integral part of an intermediate wafer, which is situated between the substrate and the sealing cap. Moreover, it is conceivable for the substrate and the sealing cap to be bonded with the aid of a bonding agent, for example in the form of an adhesive substance. The substrate and the sealing cap may be bonded to each other with the aid of an AlGe eutectic or a seal glass bonding method. It is also conceivable for the second method step to include the creation of a second channel, and for the pressure in the second cavity to also be established via the second channel in the third method step.

Advantageous embodiments and refinements of the present invention may be found herein as well as in the description with reference to the drawings.

In one further specific embodiment of the present invention, it is provided that the sealable channel is sealed with a first sealing arrangement and/or a second sealing arrangement in a fourth method step. In particular, the first sealing arrangement, in particular its viscosity, is selected in such a way that even though the first sealing arrangement partially penetrates into the sealable channel, it does not flow through the sealable channel prior to having been cured or dried. The use of a second sealing arrangement lends itself when there is a risk of gas in the contact area between the micromechanical sensor unit and the first sensor unit entering the first cavity or exiting the first cavity continuously. In this way, an advantageously particularly stable or robust seal may be implemented, and the first pressure in the first cavity may be kept constant for what may be a long time.

In one further specific embodiment of the present invention, it is provided that a recess for accommodating the first sealing arrangement is implemented in a supplemental method step. In particular, it is provided that the recess for accommodating the first sealing arrangement is integrated into the substrate and/or into the sealing cap. The recess advantageously makes it possible for the first sealing arrangement, together with the micromechanical sensor unit, to form what may be a flush finish and for the first sealing arrangement to thus seal the sealable channel in a particularly space-saving and stable manner. It is conceivable for the supplemental method step to be carried out chronologically after or prior to the first method step.

In one further specific embodiment of the present invention, it is provided that
the first sealing arrangement is situated in the recess for accommodating the first sealing arrangement in such a way that a further recess for accommodating the second sealing arrangement is implemented by the accommodation of the first sealing arrangement and/or
the second sealing arrangement is situated on the first sealing arrangement in such a way that the first sealing arrangement is completely enclosed by the second sealing arrangement and by the micromechanical sensor unit. In this way, an advantageously particularly stable and airtight seal of the sealable channel may be implemented.

In one further specific embodiment of the present invention, it is provided that, in the second method step,
the sealable channel and/or the recess for accommodating the first sealing arrangement is/are implemented with the aid of an etching process and/or
only those areas of the first cavity are etched by the etching process for the implementation of the channel which are not an integral part of the first sensor element. Etching the sealable channel has the advantage that methods known from semiconductor technology may be resorted to and no new methods must be configured. Moreover, it is conceivable that the etching processes may use etching devices for etching which were already used for manufacturing the substrate or the sealing cap. Thus, no new device for creating the sealable channel would have to be manufactured, whereby advantageously money for the procurement of such a device may be saved. In particular, it is advantageous if the position for the etching process is selected in such a way that the first sensor element is not damaged by the etching process. Moreover, it is advantageous if the etching process implements what may be a narrow sealable channel since then advantageously the material requirement for the first sealing arrangement decreases and sealing is easier to implement than for a channel having a larger diameter.

In one further specific embodiment of the present invention, it is provided that the micromechanical sensor unit includes a protective device for the second method step, the protective device including an etch stop layer, a sacrificial etching area and/or a web. The protective device is advantageously used to essentially protect the first sensor element from damage by the etching process. The protective device, or the combination of protective devices, is in particular adapted to the etching process in each case.

In one further specific embodiment of the present invention, it is provided that the first sealing arrangement at least partially includes a polymer and the second sealing arrangement at least partially includes a metal. The polymer is a photoresist, for example. As a result of the material selection, an advantageously airtight or gastight seal of the sealable channel may be implemented.

In one further specific embodiment of the present invention, it is provided that the second sealing arrangement is structured in a fifth method step. For example, the second sealing arrangement is cut to size and thus the extent of the micromechanical device is reduced. It is also conceivable that the second sealing arrangement is polished and thus a smooth surface may be implemented for the micromechanical sensor unit.

A further subject matter of the present invention is a micromechanical sensor unit, the micromechanical sensor unit having a first and a second cavity. It is provided according to the present invention that a first sensor element is situated in the first cavity at a first pressure, and a second sensor element is situated in the second cavity at a second pressure. Moreover, the micromechanical sensor unit has at least one sealable channel leading into the first cavity for establishing the first pressure in the first cavity.

As a result of the sealable channel, the micromechanical sensor unit has a particularly stable and robust device for establishing the first pressure in the first cavity. The micromechanical device typically has a main extension plane, and the sealable channel extends in a direction perpendicular to the main extension plane. Furthermore, it is conceivable that the sealable channel is situated on the substrate and/or on the sealing cap in such a way that the portion of the substrate and/or of the sealing cap without the channel completely covers the first sensor element and/or the second sensor element in a direction perpendicular to the main extension plane. In this way, advantageously the first sensor element is essentially protected from dirt or etching gases which could enter through the sealable channel.

In one further specific embodiment of the present invention, it is provided that the sealable channel is sealed with a first sealing arrangement and/or with a second sealing arrangement. This involves a particularly stable micromechanical sensor unit, which is able to provide two cavities having different pressures for different sensor elements in each case.

In one further specific embodiment of the present invention, it is provided that
the micromechanical sensor unit has a main extension plane;
the micromechanical sensor unit has a recess for accommodating the first sealing arrangement and/or
the second sealing arrangement completely covers the first sealing arrangement in a direction perpendicular to the main extension plane. Such a micromechanical sensor unit is able to advantageously keep the pressure within the first cavity constant for what may be a long time.

In one further specific embodiment, it is provided that the substrate includes an evaluation wafer having conductors, electrodes and evaluation arrangement and/or the first sensor element and/or the second, sensor element. By integrating further elements into the substrate, a particularly space-saving micromechanical sensor unit may be implemented.

In one further specific embodiment, it is provided that the first sensor element and/or the second sensor element is/are a rotation rate sensor, an acceleration sensor or a Lorentz force-based magnetic field sensor. It is an advantage to combine a wide variety of sensor elements in one micromechanical sensor unit.

DETAILED DESCRIPTION

Figure 1:
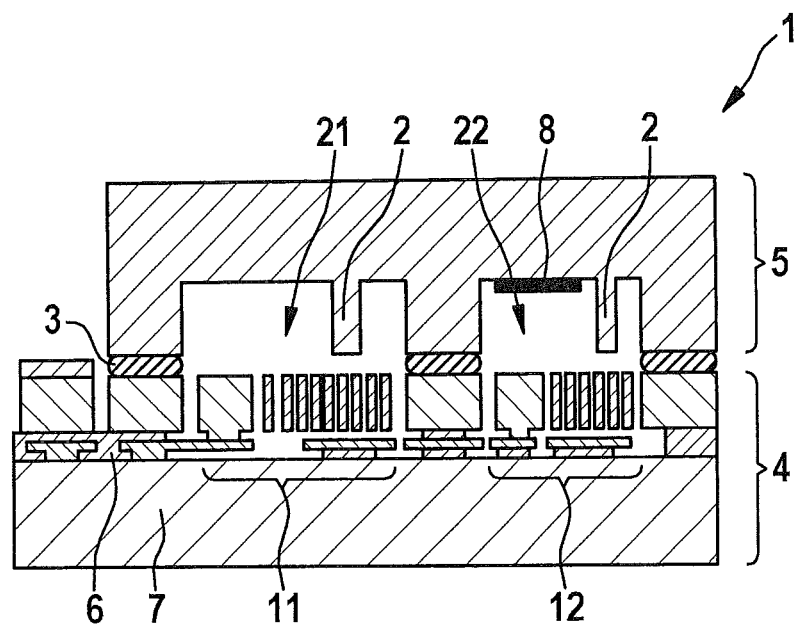
FIG. 1 shows a micromechanical sensor unit including a first sensor element and a second sensor element according to the related art.

Identical parts are always denoted by the same reference numerals in the various figures and are therefore generally also cited or mentioned only once.

FIG. 1 shows a micromechanical sensor unit 1 according to the related art. Such a micromechanical sensor unit 1 typically includes a first sensor element 11 and a second sensor element 12, first sensor element 11 and second sensor element 12 being an integral part of a substrate 4, for example. In addition to first and second sensor element 11 and 12, substrate 4 may also include a substrate main body 7 and an evaluation wafer 6 having conductors and evaluation units. With the aid of such conductors and evaluation units, which are mostly buried in evaluation wafer 6, the measured values ascertained with first and second sensor element 11 and 12 may be evaluated and/or forwarded. Moreover, micromechanical sensor unit 1 includes a sealing cap 5, which protects first and second sensor element 11 and 12 not only from the surroundings of micromechanical sensor unit 1, but also makes it possible to provide first and second sensor element 11 and 12 with an atmosphere which is optimally adapted for the particular sensor element. The designation atmosphere here shall be understood to mean a collective term which, among other things, encompasses properties such as pressure and type or kind of gas (surrounding first and second sensor element 11 and 12). In particular, it is generally provided that first sensor element 11, second sensor element 12, substrate 4, and sealing cap 5 are configured and situated, i.e., configured, in such a way that first sensor element 11 is situated or enclosed in a first cavity 21 with a first atmosphere and second sensor element 12 is situated or enclosed in a second cavity 22 with a second atmosphere.

It is conceivable that sealing cap 5 and substrate 4 are bonded to each other with the aid of a bonding agent 3. In general, stops 2 and/or anti-adhesive coatings are integrated into the cavities, which ensure or improve the functionality of first and/or second sensor element 11 and/or 12, or which prevent damage of the same during use. The first atmosphere in first cavity 21 may differ from the second atmosphere in second cavity 22. As a result of an atmosphere which is individually adapted to the sensor element, optimal boundary conditions may be implemented for the particular sensor element, the individual sensor elements being simultaneously seated on a shared substrate body 7 or being part of a shared substrate 4. For example, a micromechanical sensor unit 1 may be generated which includes an acceleration sensor as first sensor element 11 and a rotation rate sensor as second sensor element 12. While the rotation rate sensor is typically enclosed at a low pressure (1 mbar), it is desirable to operate the acceleration sensor at a high pressure (500 mbar) for optimal operation of the acceleration sensor. Thanks to the first atmosphere in first cavity 11 and the second atmosphere in second cavity 12, the first atmosphere differing from the second atmosphere, the acceleration sensor and the rotation rate sensor may then advantageously be combined in one single mechanical sensor unit 1.

In particular, it is advantageous to combine an acceleration sensor and a rotation rate sensor in one mechanical sensor unit 1 since in this way both sensors may be manufactured from one substrate 4 or on one substrate body 7, whereby also costs may be saved (compared to the individual manufacture of the acceleration sensor and the rotation rate sensor on different substrate bodies or substrates) and space-saving micromechanical devices 1 may be implemented. Different pressures in first and second cavity 21 and 22 are typically achievable with the aid of a getter 8, getter 8 being integrated into second cavity 22, for example, and being enclosed there under high pressure and finally, as a result of a temperature change of the getter, ensuring that the pressure in second cavity 22 is reduced. This method is associated with considerable additional complexity and costs in the manufacture of the micromechanical sensor unit.

Figure 2:
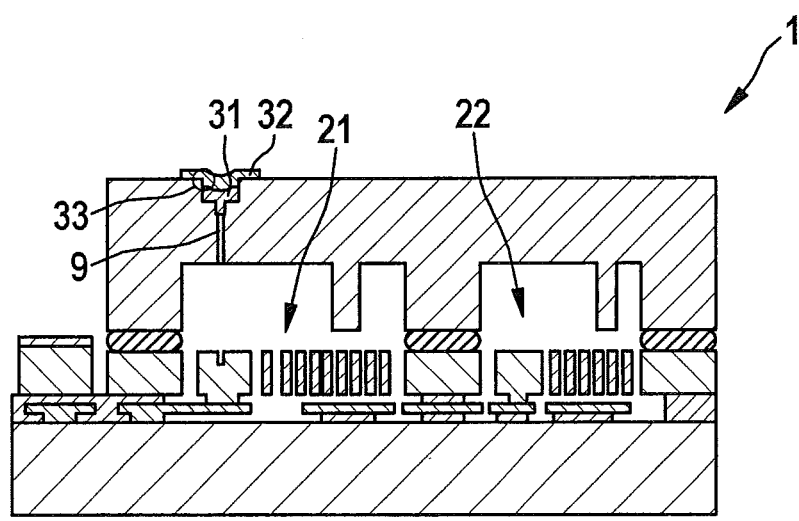
FIG. 2 shows a micromechanical sensor unit according to a first exemplary specific embodiment.
Figure 3:
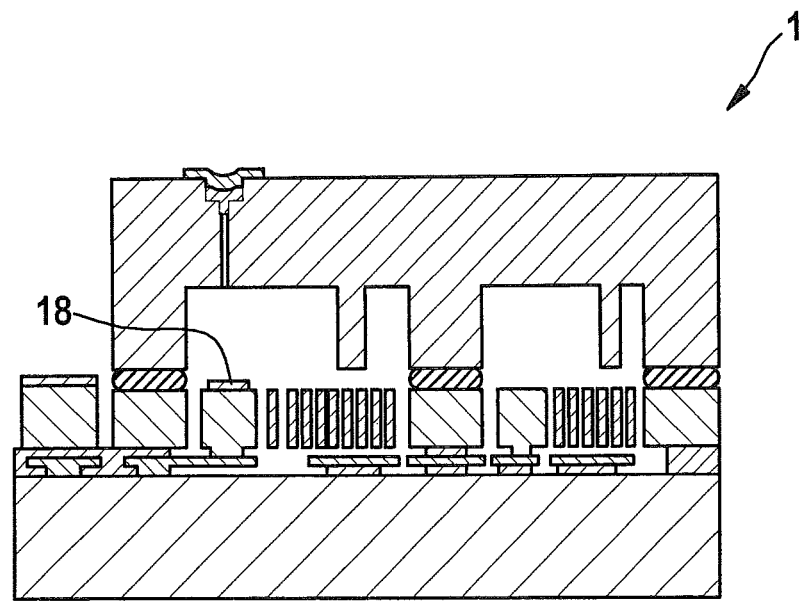
FIG. 3 shows a micromechanical sensor unit according to a second exemplary specific embodiment.
Figure 4:
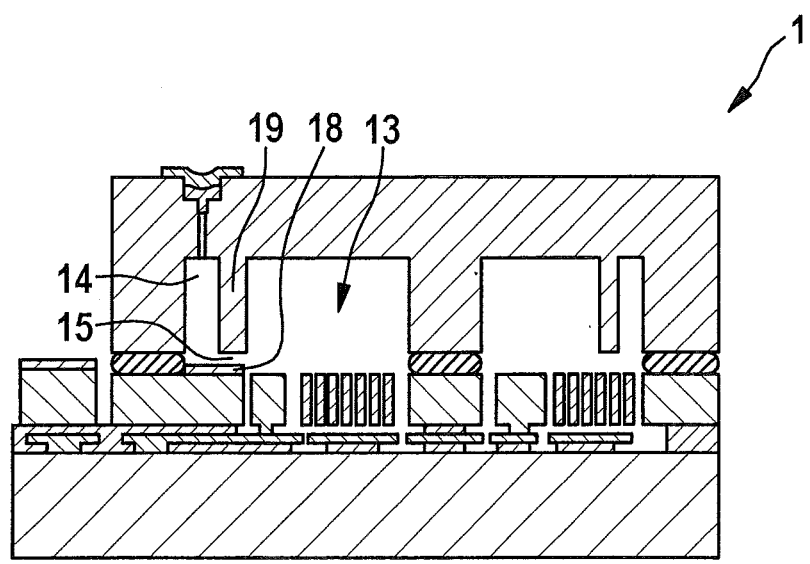
FIG. 4 shows a micromechanical sensor unit according to a third exemplary specific embodiment.

FIG. 2 shows a first exemplary specific embodiment of a micromechanical sensor unit according to the present invention. Compared to micromechanical sensor unit 1 having a first and a second cavity 21 and 22 from the related art (see FIG. 1), second cavity 22 according to first exemplary micromechanical sensor unit 1 advantageously has no getter 8. The atmosphere in second cavity 22 is thus determined during sealing during a first method step—as part of a method for manufacturing micromechanical sensor unit 1. Immediately after sealing, the first and the second atmosphere in first and second cavity 21 and 22 correspond to each other; in particular the pressure in the first cavity corresponds to the pressure in the second cavity.

To implement a first atmosphere which is distinguishable from the second atmosphere, according to the present invention a sealable channel 9 is provided, which is etched into sealing cap 5, for example, in a second method step. Channel 9 may be situated on substrate 4 in such a way that first sensor element 11 is not damaged during etching in the second method step. Channel 9 therefore particularly may be situated at the location in substrate 4 and/or of sealing cap 5 which is not situated above or beneath first sensor element 11. In FIG. 2, a sealable channel 9 was etched into sealing cap 5 in the second method step in such a way that sealable channel 9 essentially extends perpendicularly to a main extension plane of micromechanical sensor unit 1. The position to which the etching process is applied is selected in such a way that channel 9 does not extend above first sensor element 11. Instead of damaging first sensor element 11 during etching, the etching process leaves an etching mark 8 behind in substrate 4, etching mark 8 essentially not limiting or preventing the functionality of first sensor element 11.

In particular, it is provided that the width of channel 9 is considerably smaller than the lateral extension of sealing cap 5, whereby sealing of sealable channel 9 is advantageously simplified. Moreover, it is provided that the first atmosphere in first cavity 21 is settable with the aid of sealable channel 9 in such a way that the first atmosphere in first cavity 21 differs from the second atmosphere in second cavity 22. It is conceivable that the pressure and/or type of gas in second cavity 22 is/are variable or manipulatable after the second method step by admitting a gas and/or discharging a gas. In a third method step, sealable channel 9 is subsequently sealed with a first and a second sealing arrangement 31 and 32. First sealing arrangement 31 may be a polymer, such as a photoresist. Sealing arrangement 31 particularly may be an organic resist, in particular a fluorine-based resist, such as polyimides, which withstand temperatures above more than 200° C. Covering first sealing arrangement 31 with second sealing arrangement 32 advantageously causes a hermetic seal and reinforces the seal of sealable channel 9, in particular in contact area 33 between first sealing arrangement 31 and second sealing arrangement 32.

Second sealing arrangement 32 may be a metallic coating layer, in particular an aluminum coating layer, the metallic coating layer completely covering first sealing arrangement 31. Moreover, it is provided that sealing cap 5 has a recess 40 for accommodating first sealing arrangement 31. In this way, first and second sealing arrangement 31 and 32 are advantageously situatable in a space-saving manner on micromechanical sensor unit 1. It is provided that first sealing arrangement 31 does not protrude from recess 40 for accommodating first sealing arrangement 31, recess 40 for accommodating first sealing arrangement 31 may be adapted in its extension in a direction perpendicular to the main extension plane. In particular, it is provided that a further recess 42 for accommodating second sealing arrangement 32 is implemented by at least partially filling recess 40 for accommodating first sealing arrangement 31, further recess 42 being essentially situated above recess 40 for accommodating first sensor element 31. Furthermore, it is provided that second sealing arrangement 32 is configured in such a way that second sealing arrangement 32 is essentially thicker than the maximal extension of further recess 42 for accommodating second sealing arrangement 32 in a direction perpendicular to the main extension plane. In this way, an advantageously particularly stable mechanical seal of sealable channel 9 may be implemented.

FIGS. 3 through 7 show various exemplary micromechanical devices 1 according to the present invention. All specific embodiments shown supplement the first exemplary micromechanical sensor unit 1 according to the present invention in each case by at least one protective device, the protective device protecting first sensor element 11 from the etching process in the second method step, and thereby positively increasing the likelihood of a functionally capable first sensor element 11. In the second exemplary specific embodiment, substrate 4 is at least partially covered with an etch stop layer 18, which essentially prevents an etching of substrate 4. In the third specific embodiment, sealing cap 5 includes a web 19, which protrudes into first cavity 21 in such a way that first cavity 21 is divided into a ventilation area 14 and a sensor element area 13, sensor element area 13 and ventilation area 14 sharing the same first atmosphere via a connecting channel 15. In particular, substrate 4 is covered with etch stop layer 18 in the area of ventilation area 14 and of connecting channel 15.

Figure 5:
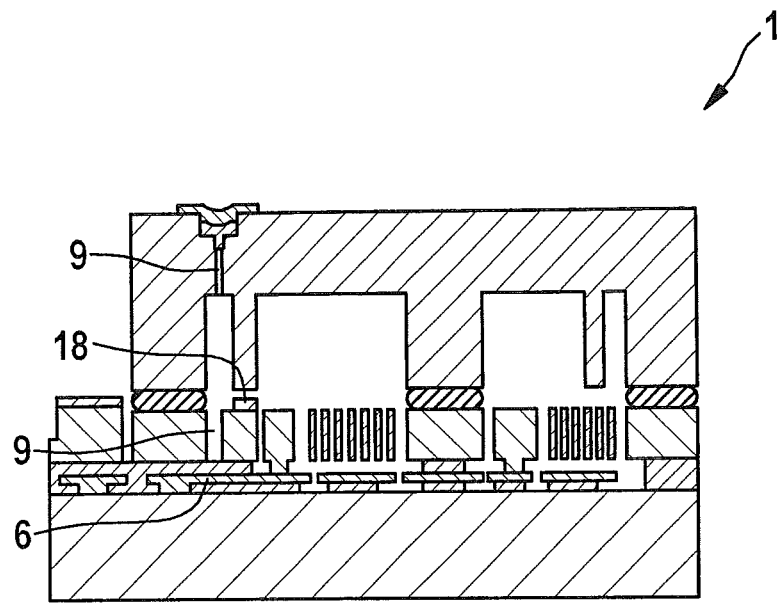
FIG. 5 shows a micromechanical sensor unit according to a fourth exemplary specific embodiment.
Figure 6:
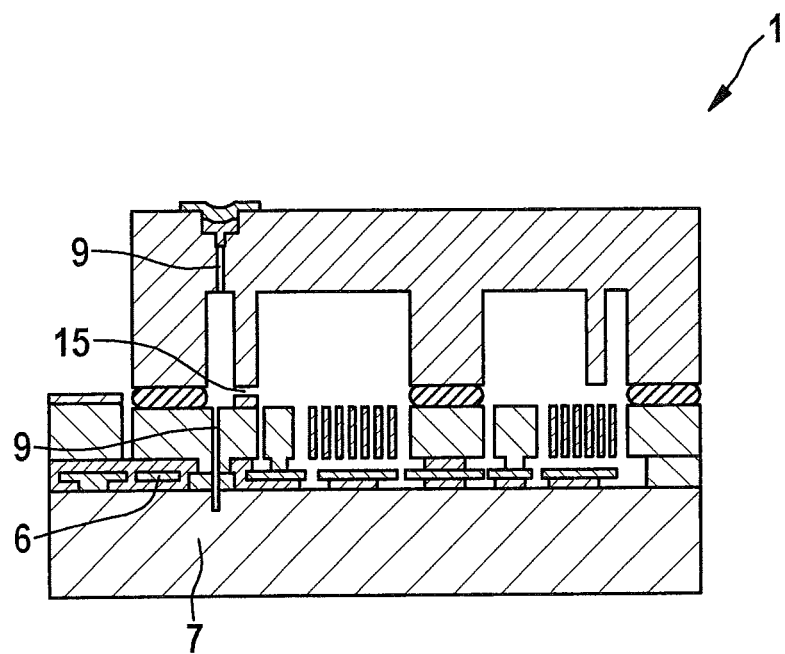
FIG. 6 shows a micromechanical sensor unit according to a fifth exemplary specific embodiment.
Figure 7:
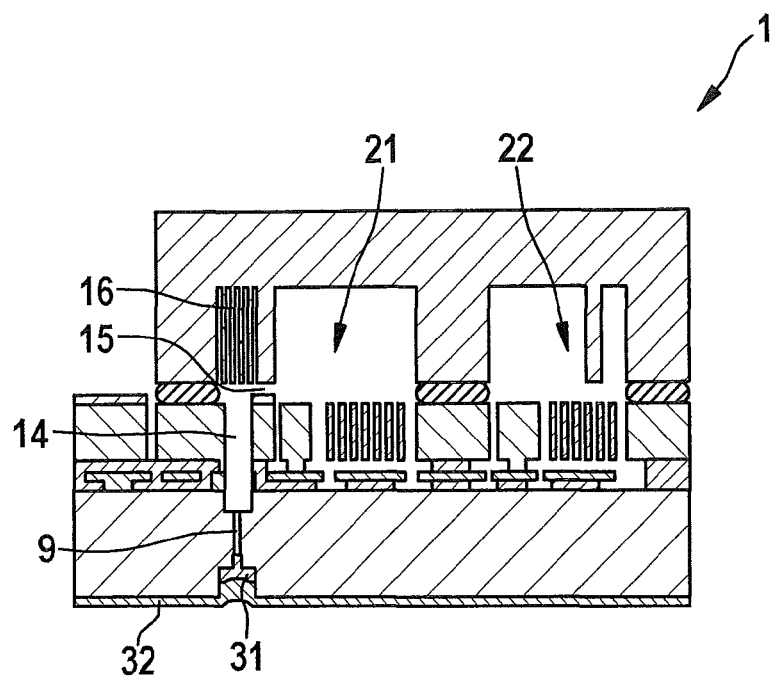
FIG. 7 shows a micromechanical sensor unit according to a sixth exemplary specific embodiment.

Connecting channel 15 may extend in parallel to the main extension plane of micromechanical sensor unit 1. In the fourth specific embodiment, in contrast, etch stop layer 18 only extends in the area of connecting channel 15. In this way, material for the etch stop layer is advantageously saved, and it is possible—as is shown in FIG. 5—to etch far enough into substrate 4 for evaluation wafer 6 to be exposed. It is also conceivable that the etching process is continued until channel 9 extends from sealing cap 5 to substrate body 7, as is shown in FIG. 6. In the sixth exemplary micromechanical sensor unit 1 according to the present invention, it is provided that sealable channel 9 is situated in substrate 4.

A sacrificial layer 16 may be situated within first cavity 21 beneath or above sealable channel 9. Sacrificial layer 16 in particular has a large surface and a connecting channel 15 and is provided to at least partially dissipate an isotropic etching gas.

Figure 8:
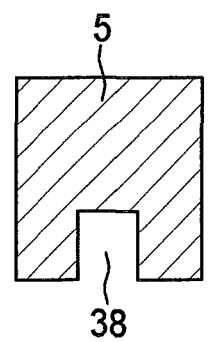
FIG. 8 shows an exemplary method for manufacturing a micromechanical sensor unit according to the present invention, the individual drawings 8a through 8h being snapshots of this exemplary method.
Figure 8:
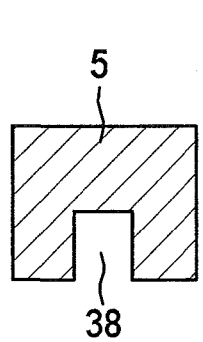
Figure 8:
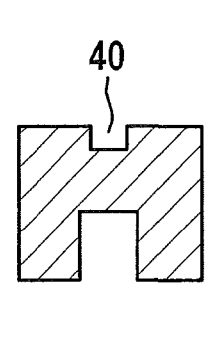
Figure 8:
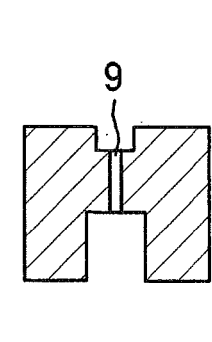
Figure 8:
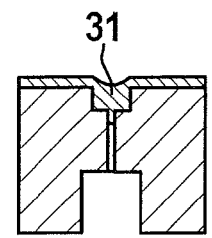
Figure 8:
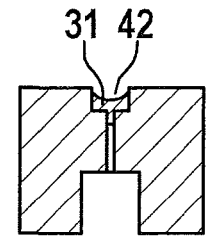
Figure 8:
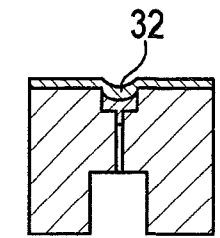
Figure 8:
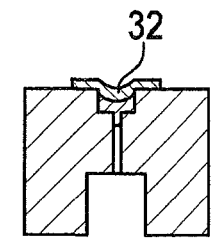

FIG. 8 shows an exemplary method for manufacturing a micromechanical sensor unit 1 according to the present invention, in FIGS. 8a through 8h snapshots of a sealing cap 5 (a first cavity of the micromechanical sensor unit) being shown continuously in each case after consecutive method steps. FIG. 8a shows a sealing cap 5, which has a hollow 38 on its lower side which is provided for the formation of first cavity 21. Such a starting shape of sealing cap 5 may be subsequently optimized (see 8b), for example, by flattening the same, whereby a space-saving sealing cap 5 may be implemented. In FIG. 8c, the recess for accommodating the first sealing arrangement is implemented in a supplemental method step. Thereafter, in the second method step, a sealable channel 9, which may be a narrow channel 9, is etched into sealing cap 5. In particular, it is conceivable that, after one of the manufacturing processes shown in 8a through 8d, sealing cap 5 is bonded in a first method step with substrate 4 in such a way that a first cavity 21 is formed. In other words, it is conceivable that the first method step takes place chronologically prior to or chronologically after the second method step, but chronologically prior to the third method step. FIG. 8e shows sealing cap 5 after sealing cap 5 has been covered with first sealing arrangement 31 on the surface side extending in parallel to the main extension plane and facing away from substrate 4 (not shown). The viscosity of first sealing arrangement 31 may be selected in such a way that first sealing arrangement 31 at least partially fills sealable channel 9 and does not flow through sealable channel 9.

In particular, first sealing arrangement 31 has such high surface tension that sealing arrangement 31 does not flow into first cavity 21 prior to curing. Subsequently, a portion of first sealing arrangement 31 situated on sealing cap 5 is removed again. In particular, first sealing arrangement 31 is removed in such a way that a further recess 42 for accommodating the second sealing arrangement is created. This is shown in FIG. 8f. Subsequently, sealing cap 5 is covered with the second sealing arrangement in a planar manner in such a way that second sealing arrangement 32 covers both first sealing arrangement 31 and the surface side of sealing cap 5 which is situated in parallel to the main extension plane and on the side facing away from substrate 4. In particular, it is provided that no interspace is created between the first and second sealing arrangement. In a final fourth method step, second sealing arrangement 32 is structured. For example, in FIG. 8h, the extension of second sealing arrangement 32 is reduced in parallel to the main extension plane, it being provided that, after the reduction, the extension of second sealing arrangement 32 in parallel to the main extension plane is greater than that of first sealing arrangement 31 and that second sealing arrangement 32 completely covers first sealing arrangement 31, whereby the covering may take place in such a way that the sealable channel is hermetically and permanently sealed.

What is claimed is:

1. A method for manufacturing a micromechanical sensor unit, the micromechanical sensor unit including a substrate and a sealing cap, the method comprising:
   configuring and joining the substrate and the sealing cap so that, as a result of bonding the sealing cap and the substrate, a first cavity, which has a first pressure and in which a first sensor element is situated, and a second cavity, which has a second pressure and in which a second sensor element is situated, are created;

creating a sealable channel leading into the first cavity;

changing the first pressure in the first cavity via the sealable channel;

sealing the sealable channel with a first sealing arrangement and/or a second sealing arrangement; and implementing a recess for accommodating the first sealing arrangement;

wherein the first sealing arrangement is situated in the recess for accommodating the first sealing arrangement so that a further recess for accommodating the second sealing arrangement is implemented by the accommodation of the first sealing arrangement, and/or the second sealing arrangement is situated on the first sealing arrangement so that the first sealing arrangement is completely enclosed by the second sealing arrangement and by the micromechanical sensor unit.

2. The method of claim 1, wherein, in the creating task, the sealable channel and/or the recess for accommodating the first sealing arrangement is/are implemented with the aid of an etching process, and/or only those areas of the first cavity are etched by the etching process for the implementation of the channel which are not an integral part of the first sensor element.

3. The method of claim 1, wherein the first sealing arrangement at least partially includes a polymer and the second sealing arrangement at least partially includes a metal.

4. A method for manufacturing a micromechanical sensor unit, the micromechanical sensor unit including a substrate and a sealing cap, the method comprising:

configuring and joining the substrate and the sealing cap so that, as a result of bonding the sealing cap and the substrate, a first cavity, which has a first pressure and in which a first sensor element is situated, and a second cavity, which has a second pressure and in which a second sensor element is situated, are created;

creating a sealable channel leading into the first cavity; and changing the first pressure in the first cavity via the sealable channel;

wherein the micromechanical sensor unit includes a protective device for the creating task, the protective device including at least one of an etch stop layer, a sacrificial etching area, and a web.

5. A method for manufacturing a micromechanical sensor unit, the micromechanical sensor unit including a substrate and a sealing cap, the method comprising:

configuring and joining the substrate and the sealing cap so that, as a result of bonding the sealing cap and the substrate, a first cavity, which has a first pressure and in which a first sensor element is situated, and a second cavity, which has a second pressure and in which a second sensor element is situated, are created;

creating a sealable channel leading into the first cavity;

changing the first pressure in the first cavity via the sealable channel;

sealing the sealable channel with a first sealing arrangement and/or a second sealing arrangement;

implementing a recess for accommodating the first sealing arrangement; and structuring the second sealing arrangement.

6. A micromechanical sensor unit, comprising:

a first cavity, which has a first pressure and in which a first sensor element is situated; and a second cavity, which has a second pressure and in which a second sensor element is situated;

wherein the first cavity has a sealable channel for establishing the first pressure in the first cavity;

wherein the sealable channel is sealed with a first sealing arrangement and/or with a second sealing arrangement; and wherein the first sealing arrangement is situated in a recess for accommodating the first sealing arrangement so that a further recess for accommodating the second sealing arrangement is implemented by the accommodation of the first sealing arrangement, and/or the second sealing arrangement is situated on the first sealing arrangement so that the first sealing arrangement is completely enclosed by the second sealing arrangement and by the micromechanical sensor unit.

7. The micromechanical sensor unit of claim 6, wherein the first sensor element and/or the second sensor element is/are a rotation rate sensor, an acceleration sensor, or a Lorentz force-based magnetic field sensor.

* * * * *